United States Patent
Krah et al.

(10) Patent No.: US 11,636,702 B2
(45) Date of Patent: Apr. 25, 2023

(54) OPTICAL-FINGERPRINT DETECTION SYSTEM

(71) Applicant: Apple Inc., Cupertino, CA (US)

(72) Inventors: Christoph H. Krah, Cupertino, CA (US); Mohammad Yeke Yazdandoost, San Jose, CA (US)

(73) Assignee: Apple Inc., Cupertino, CA (US)

( * ) Notice: Subject to any disclaimer, the term of this patent is extended or adjusted under 35 U.S.C. 154(b) by 433 days.

(21) Appl. No.: 16/711,323

(22) Filed: Dec. 11, 2019

(65) Prior Publication Data

US 2020/0210673 A1 Jul. 2, 2020

Related U.S. Application Data

(60) Provisional application No. 62/785,139, filed on Dec. 26, 2018.

(51) Int. Cl.
| | |
|---|---|
| *G06V 40/00* | (2022.01) |
| *G06V 40/13* | (2022.01) |
| *H04N 5/357* | (2011.01) |
| *H01L 27/30* | (2006.01) |
| *H04N 5/378* | (2011.01) |

(52) U.S. Cl.
CPC ........... *G06V 40/13* (2022.01); *H04N 5/3575* (2013.01); *H01L 27/307* (2013.01); *H04N 5/378* (2013.01)

(58) Field of Classification Search
CPC ...... G06V 40/13; H04N 5/3575; H04N 5/378; H01L 27/307
See application file for complete search history.

(56) References Cited

U.S. PATENT DOCUMENTS

| | | |
|---|---|---|
| 2002/0057845 A1 | 5/2002 | Fossum et al. |
| 2004/0183928 A1 | 9/2004 | Tay |
| | (Continued) | |

FOREIGN PATENT DOCUMENTS

| | | |
|---|---|---|
| CN | 205142377 | 4/2016 |
| CN | 106022271 | 10/2016 |
| | (Continued) | |

OTHER PUBLICATIONS

Invitation to Pay Additional Fees from PCT/US2019/063440, dated Apr. 3, 2020, 13 pages.

(Continued)

*Primary Examiner* — Kevin K Pyo
(74) *Attorney, Agent, or Firm* — BakerHostetler

(57) ABSTRACT

A method of temperature compensation in an optical-fingerprint detection system includes acquiring a first reading associated with one or more pixels of an array. The first reading is a baseline reading. The method further includes acquiring a second reading associated with the one or more pixels of the array. The second reading includes the baseline plus a signal. Producing a temperature compensated signal reading by subtracting the first reading from the second reading. The array is an optical-fingerprint array, and each pixel of the array is coupled to a readout circuit via a pixel switch. The method includes row-based and frame-based schemes and a blind pixel scheme. Readout circuit improvements including multiplexed analog front-end (AFE), charge magnifier with column charge offset compensation and a low-noise gate driver circuit are provided.

7 Claims, 13 Drawing Sheets

(56) References Cited

U.S. PATENT DOCUMENTS

| | | | |
|---|---|---|---|
| 2005/0174015 A1 | 8/2005 | Scott | |
| 2007/0273775 A1* | 11/2007 | Jiang | H04N 5/361 |
| | | | 348/E5.081 |
| 2008/0123908 A1 | 5/2008 | Waldman et al. | |
| 2009/0252385 A1 | 10/2009 | Dean | |
| 2017/0124370 A1 | 5/2017 | He et al. | |
| 2017/0359540 A1 | 12/2017 | Muto et al. | |
| 2018/0114815 A1 | 4/2018 | Lee et al. | |
| 2018/0224564 A1 | 8/2018 | Fu et al. | |
| 2018/0232101 A1 | 8/2018 | Fotopoulos | |
| 2018/0260602 A1 | 9/2018 | He et al. | |

FOREIGN PATENT DOCUMENTS

| | | |
|---|---|---|
| CN | 106886743 | 6/2017 |
| CN | 107077614 | 8/2017 |
| CN | 108664955 | 10/2018 |
| EP | 3242193 | 11/2017 |
| WO | WO 2012/158950 | 11/2012 |
| WO | WO 2018/127101 | 7/2018 |

OTHER PUBLICATIONS

International Search Report and Written Opinion from PCT/US2019/063440, dated Jun. 25, 2020, 23 pages.
Indian Office Action from Indian Patent Application No. 202117028186, dated Mar. 1, 2022, 6 pages.

* cited by examiner

OPTICAL-FINGERPRINT DETECTION SYSTEM

CROSS-REFERENCE TO RELATED APPLICATION

This application claims the benefit of U.S. Provisional Application No. 62/785,139, entitled "OPTICAL-FINGERPRINT DETECTION SYSTEM," filed Dec. 26, 2018, the entirety of which is incorporated herein by reference.

TECHNICAL FIELD

The present description relates generally to integrated circuits and, more particularly, to an optical-fingerprint detection system.

BACKGROUND

Fingerprint sensing and matching is widely used as a reliable technique for personal identification or verification. In particular, a common approach to fingerprint identification involves scanning a sample fingerprint of a person to form an image and storing the image as a unique characteristic of the person. The characteristics of the sample fingerprint may be compared to information associated with reference fingerprints already stored in a database to determine proper identification of the person, such as for verification purposes.

An optical fingerprint sensor may be particularly advantageous for verification and/or authentication in an electronic device and, more particularly, a portable device, for example, a portable communication device. The optical fingerprint sensor may be carried by the housing of a portable communication device, for example, and may be sized to sense a fingerprint from a single finger. Where an optical fingerprint sensor is integrated into an electronic device or host device, for example, as noted above, the authentication can be performed quickly, for example, by a processor of the host device.

The optical fingerprint sensor can, for example, be an organic optical detector (OPD) imager such as a thin-film-transistor-based (TFT-based) OPD imager, a PIN diode-based photodetector, and/or another photodetector. A TFT-based OPD imager is an OPD imager that is fabricated on a TFT-based electronic readout backplane. An OPD imager can be an array of organic semiconductor photodiodes arranged in multiple (N) rows and multiple (e.g., M) columns. Each row of the OPD imager can be read out with a multi-channel analog front-end (AFE) circuit, where the number of channels is equal to the number of columns (e.g., M) of the OPD imager. Each channel of the AFE circuit reads a charge associated with a pixel (e.g., an OPD).

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

Figure 1A:
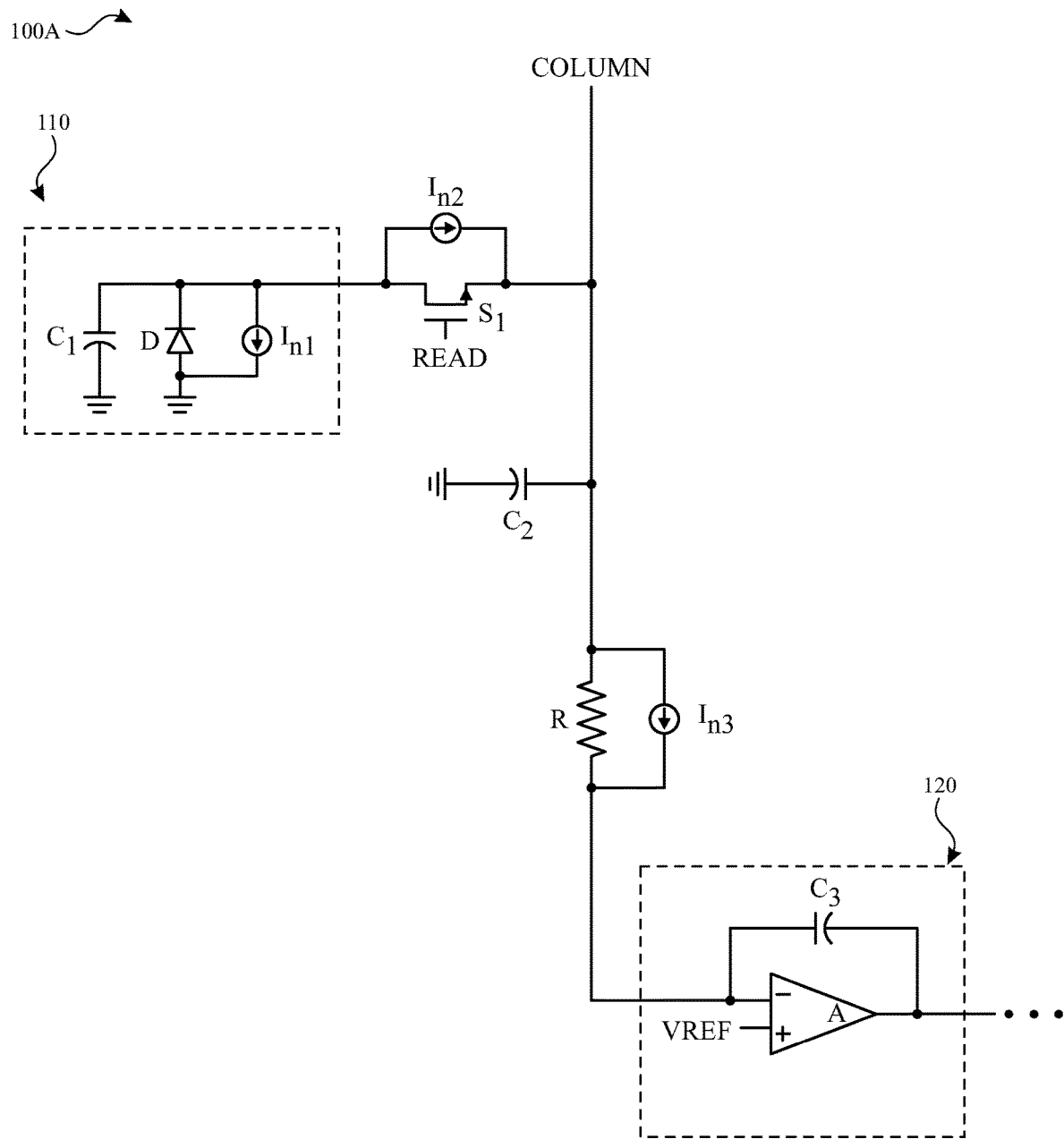
FIGS. 1A-1B are diagrams illustrating examples of a passive pixel sensor (PPS) configuration and an active pixel sensor (APS) configuration in an optical-fingerprint detection system, in accordance with one or more aspects of the subject technology.

The detailed description set forth below is intended as a description of various configurations of the subject technology and is not intended to represent the only configurations in which the subject technology may be practiced. The appended drawings are incorporated herein and constitute part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in a block diagram form in order to avoid obscuring the concepts of the subject technology. In one or more aspects, the subject technology is directed to methods and configuration for temperature compensation in an optical-fingerprint detection system. The method includes acquiring a first reading associated with one or more pixels of an array, the first reading is a baseline reading. The method further includes acquiring a second reading associated with the one or more pixels of the array. The second reading includes the baseline plus a signal. A temperature compensated signal reading can be produced by subtracting the first reading from the second reading. The array includes an optical-fingerprint array, and each pixel of the array is coupled to a readout circuit via a pixel switch.

In some implementations, the temperature compensation method is a row-based scheme. In the row-based scheme, the one or more pixels of the array are pixels of a row of the array, and the first reading is acquired while corresponding pixel switches are open. The second reading is acquired while corresponding pixel switches are closed.

In one or more implementations, the temperature compensation method is a blind pixel scheme. In this scheme, the one or more pixels of the array include entire pixels of the array. Pixels of one or more columns of the array are blind pixels that are shielded from optical exposure. In the blind pixel scheme, the first reading acquired by a first row-based double sampling for blind pixels, and the second reading is acquired by a second row-based double sampling for exposed pixels.

In some implementations, the temperature compensation method is a frame-based scheme, in which the one or more pixels of the array include entire pixels of the array. In this scheme, the first reading is acquired by using a first frame-based double sampling while the array is not illuminated, and the second reading is acquired by using a second frame-based double sampling while the array is illuminated. In one or more implementations, the temperature compensation method is a combination of the row-based scheme, the blind scheme and the frame-based scheme.

In some implementations, the subject technology provides an analog front-end (AFE) circuit for reading a column of an optical fingerprint array. The AFE circuit includes a differential charge-sensitive amplifier that receives a charge signal from an optical sensor of the optical fingerprint array and generates a voltage signal. A gain stage is coupled to an output node of the differential charge-sensitive amplifier, and an analog-to-digital converter (ADC) circuit is used to convert an output voltage of the gain stage to a digital signal. The gain stage can reduce a total sensor-referred noise of the AFE circuit. An offset signal is applied to an inverting input of the differential charge-sensitive amplifier to improve a dynamic range of the ADC.

In one or more implementations, the gain stage can reduce the total sensor-referred noise of the AFE circuit by a factor within a range of about 4 to 5. The optical fingerprint array can be a thin-film-transistor (TFT) imager including organic photo detector (OPD) sensors.

In some implementations, the subject technology provides an optical fingerprint readout circuit that includes a number of multiplexed AFE circuits. Each multiplexed AFE circuit includes a single charge-sensitive amplifier and can receive input signals from N columns of an optical fingerprint array and generate N differential signals. Multiple ADC circuits are coupled to the AFE circuits. Each ADC circuit can convert the N differential signals to digital signals. The multiplexed AFE circuit further includes an input N-to-1 analog multiplexer and an output 1-to-N analog demultiplexer.

In one or more implementations, the optical fingerprint sensor array includes M columns, and the signals from the M columns are read out by N-multiplexed AFE circuits. The ratio M/N can be substantially larger than one.

In some implementations, the subject technology provides a readout circuit that includes a charge magnifier circuit coupled to an optical fingerprint sensor. The charge magnifier circuit can reduce an input-referred noise of the readout circuit. A data acquisition circuit is coupled to the charge magnifier circuit. The charge magnifier circuit includes a differential amplifier circuit and a feedback capacitor coupled between an inverting input and an output node of the differential amplifier circuit. A non-inverting input of the differential amplifier circuit is coupled to a reference voltage. A reset switch is coupled in parallel with the feedback capacitor. The reset switch is closed at an initial time $t_0$ to reset the charge magnifier circuit. The input-referred noise of the readout circuit is reduced by a gain of the charge magnifier circuit, as discussed herein.

In one or more implementations, the gain of the charge magnifier circuit is determined by a capacitance of the feedback capacitor and an output capacitance of the charge magnifier circuit. The data acquisition circuit can be an auxiliary data acquisition system (ADAS). As shown herein, the input-referred noise of the readout circuit is significantly less than an input-referred noise of the ADAS.

In some implementations, the readout circuit further includes a column offset cell including a first switch and a second switch and an offset capacitor. The column offset cell can provide an offset charge. In one or more implementations, the offset charge is applied to the non-inverting input of the differential amplifier circuit to be subtracted from a charge provided by the optical fingerprint sensor. The first switch is closed at the initial time $t_0$ to charge up the offset capacitor from an external source and the second switch is closed at the same time that a sensor switch is closed, as described herein.

In some implementations, the column offset cell is used to provide the reference voltage coupled to the non-inverting input of the differential amplifier circuit.

In one or more implementations, the reference voltage is a controllable bias voltage provided by a bias control circuit. The bias control circuit can set the controllable bias voltage to a first bias voltage during even frames and to set the controllable bias voltage to a second bias voltage during odd frames. To perform a frame-based offset compensation, the optical fingerprint sensor is reset using the first bias voltage during the even frames and is read using the second bias voltage during the odd frames.

In some implementations, the readout circuit further includes a low-noise gate driver circuit that can provide a low-noise supply voltage for gate drivers of gate nodes of sensor switches that are used to selectively couple the optical fingerprint sensor to a column line feeding the readout circuit. In one or more implementations, the low-noise gate driver circuit includes a low-pass filter (LPF) circuit to reduce a noise of a first (direct current) DC supply voltage source, and a low-noise buffer circuit coupled to the LPF circuit to provide the low-noise supply voltage. A bias voltage of the low-noise buffer circuit is provided by a bias circuit that includes a pi-network and a pre-regulator. The pi-network is coupled to a second DC supply voltage source and can substantially reduce ripples of the second DC supply voltage source. The pre-regulator is coupled to the pi-network and provides the bias voltage of the low-noise buffer circuit.

Figure 1B:
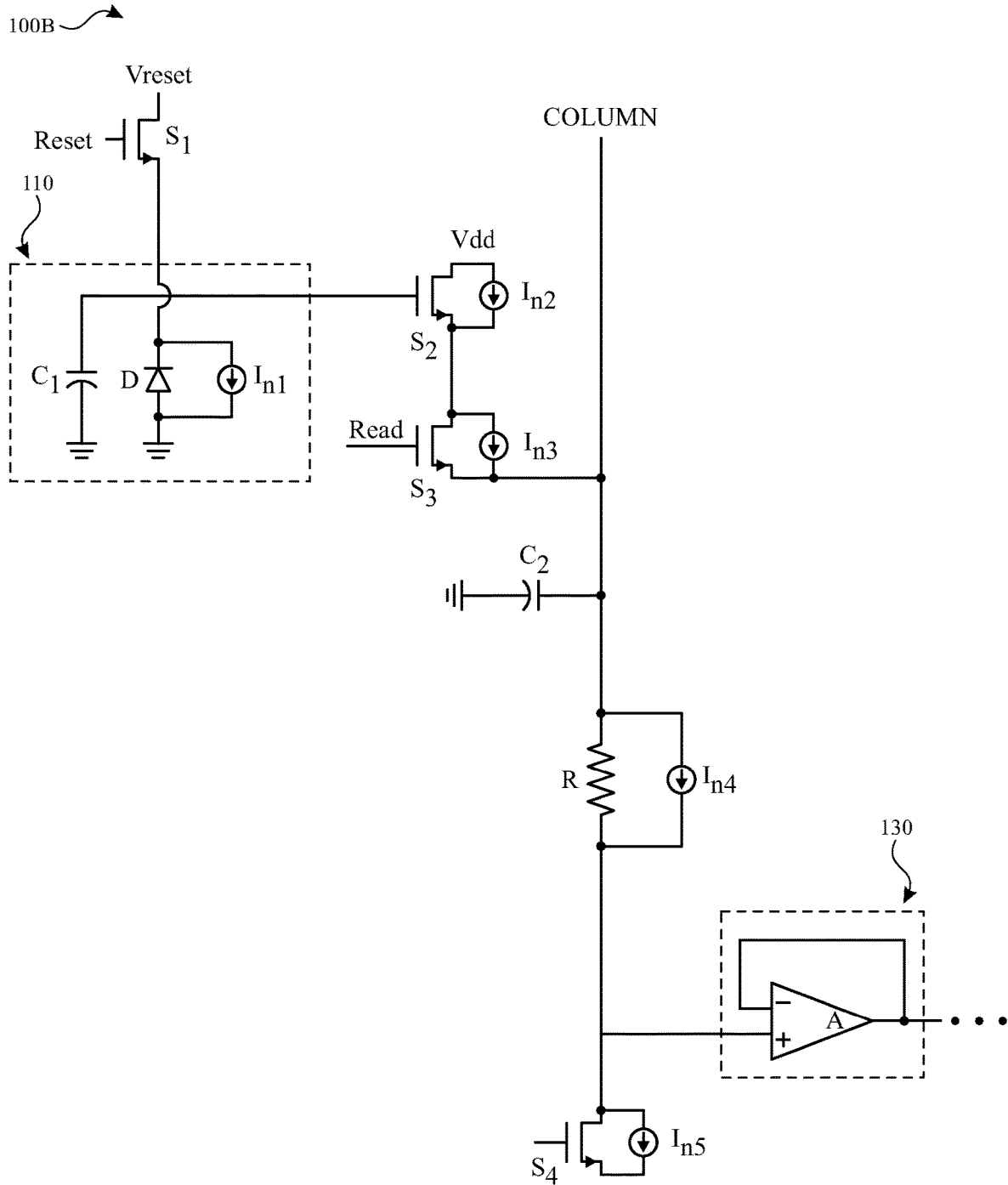

FIGS. 1A-1B are diagrams illustrating examples of a passive pixel sensor (PPS) configuration 100A and an active pixel sensor (APS) configuration 100B in an optical-fingerprint detection system, in accordance with one or more aspects of the subject technology. Example PPS configuration 100A includes an equivalent circuit 110 of an OPD, a read switch $S_1$, a data-line resistor R, a data-line capacitor $C_2$ and a readout electronics 120. Equivalent circuit 110 includes a capacitance $C_1$, a diode D and current source $I_{n1}$ that represents a noise current associated with the OPD. Current sources $L_{n2}$ and $L_{n3}$ represent the noise currents associated with read switch $S_1$ and data-line resistor R, respectively. In one or more implementations, the read switch $S_1$ can be realized using a transistor such as a metal-oxide semiconductor (MOS) transistor. The readout electronics 120 is an AFE, of which simply a first stage including a charge sensitive amplifier (CSA) is shown. The CSA includes an amplifier A with a negative feedback capacitor $C_3$. Read switch $S_1$ couples the OPD to a column of the multiple columns of a TFT-imager array, when it receives a suitable signal (e.g., Read signal) at its gate terminal. It is understood that PPS configuration 100A operates in a charge or current mode.

Example APS configuration 100B includes equivalent circuit 110, transistors $S_1$, $S_2$, $S_3$ and $S_4$ and respective associated noise current sources $I_{n1}$, $I_{n2}$, $I_{n3}$ and $I_{n5}$, a data-line resistor R and an associated noise current source $I_{n4}$, a data-line capacitor $C_2$ and a readout electronics 130. Transistor $S_1$ is a reset switch and can turn on upon receiving a suitable reset signal at its gate terminal. Transistor $S_3$ is a read switch and couples the OPD to a column of the multiple columns of a TFT-imager array, when it receives a suitable signal (e.g., Read signal) at its gate terminal. In one or more implementations, transistors $S_1$, $S_2$, $S_3$ and $S_4$ can be realized using MOS transistors. Transistor $S_2$ forms a source follower with transistor $S_4$ and provides a voltage that is proportional to the OPD charge to readout electronics 130. As seen from the circuit in FIG. 1B, PPS configuration 100B operates in a voltage mode, which enjoys a larger linear range. Transistor $S_2$ converts the OPD charge to a voltage signal that is provided to readout electronic 130 via the source follower formed by transistors $S_2$ and $S_4$. The readout electronics 130 is an AFE, of which simply a buffer circuit is shown in FIG. 1B. The buffer circuit is formed of an amplifier A with short-circuit feedback.

In many applications discussed herein, PPS configuration 100A can be more favorable than APS configuration 100B in terms of sensor noise and settling speed. For example, a typical PPS configuration may have a sensor noise within a range of about 200-300 electrons and a time constant of a few tens of nanoseconds (ns), whereas the sensor noise and time constant for a typical APS configuration can be within a range of about 500-600 electrons and a few microseconds (μs), respectively. Meanwhile, the lower noise and faster settling time of PPS configuration 100A is a better match to requirements of double sampling (DS, e.g., correlated DS) scheme used herein.

Figure 2A:
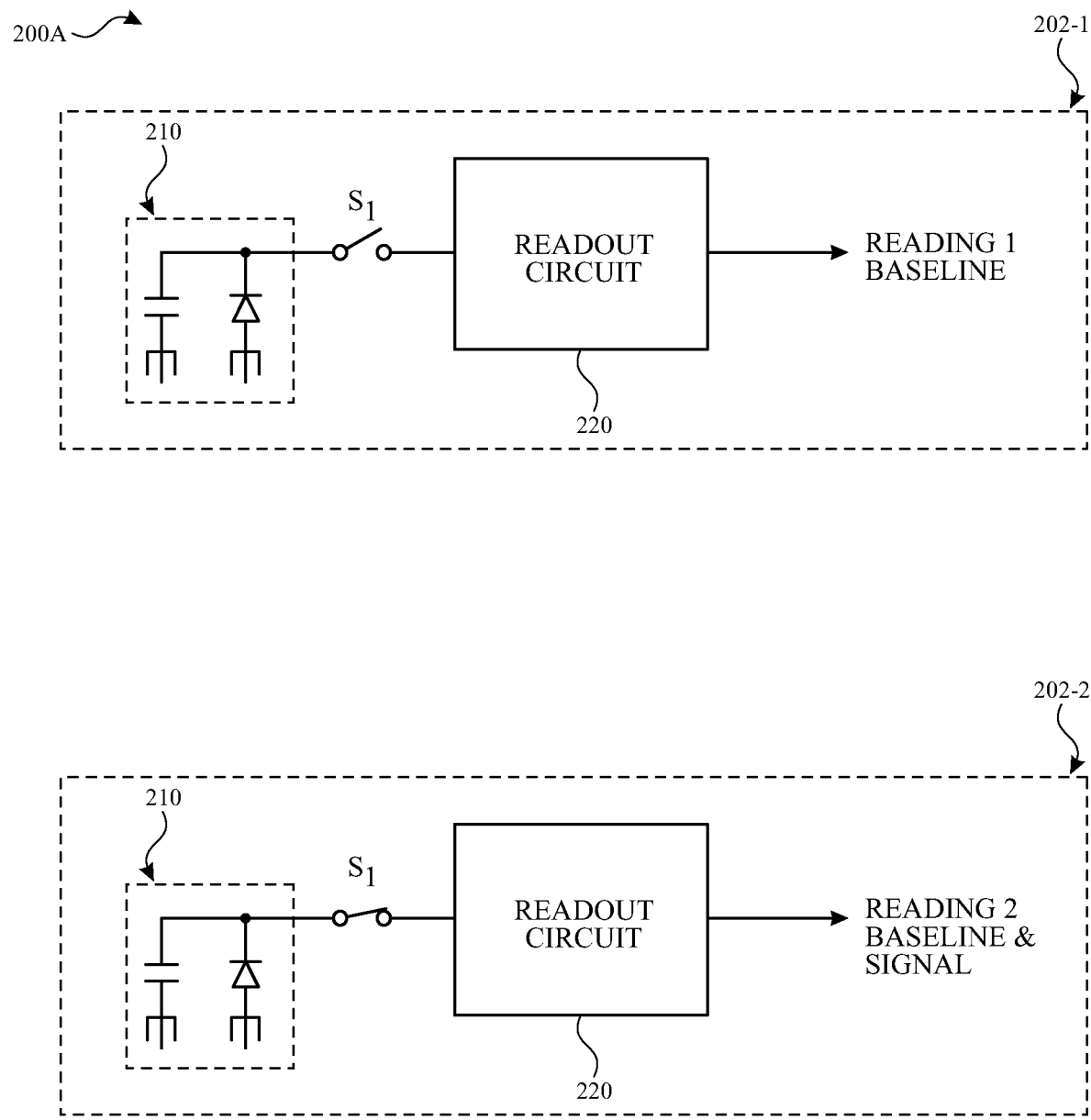
FIGS. 2A through 2C are diagrams illustrating example schemes for temperature compensation in an optical-fingerprint detection system, in accordance with one or more aspects of the subject technology.
Figure 2B:
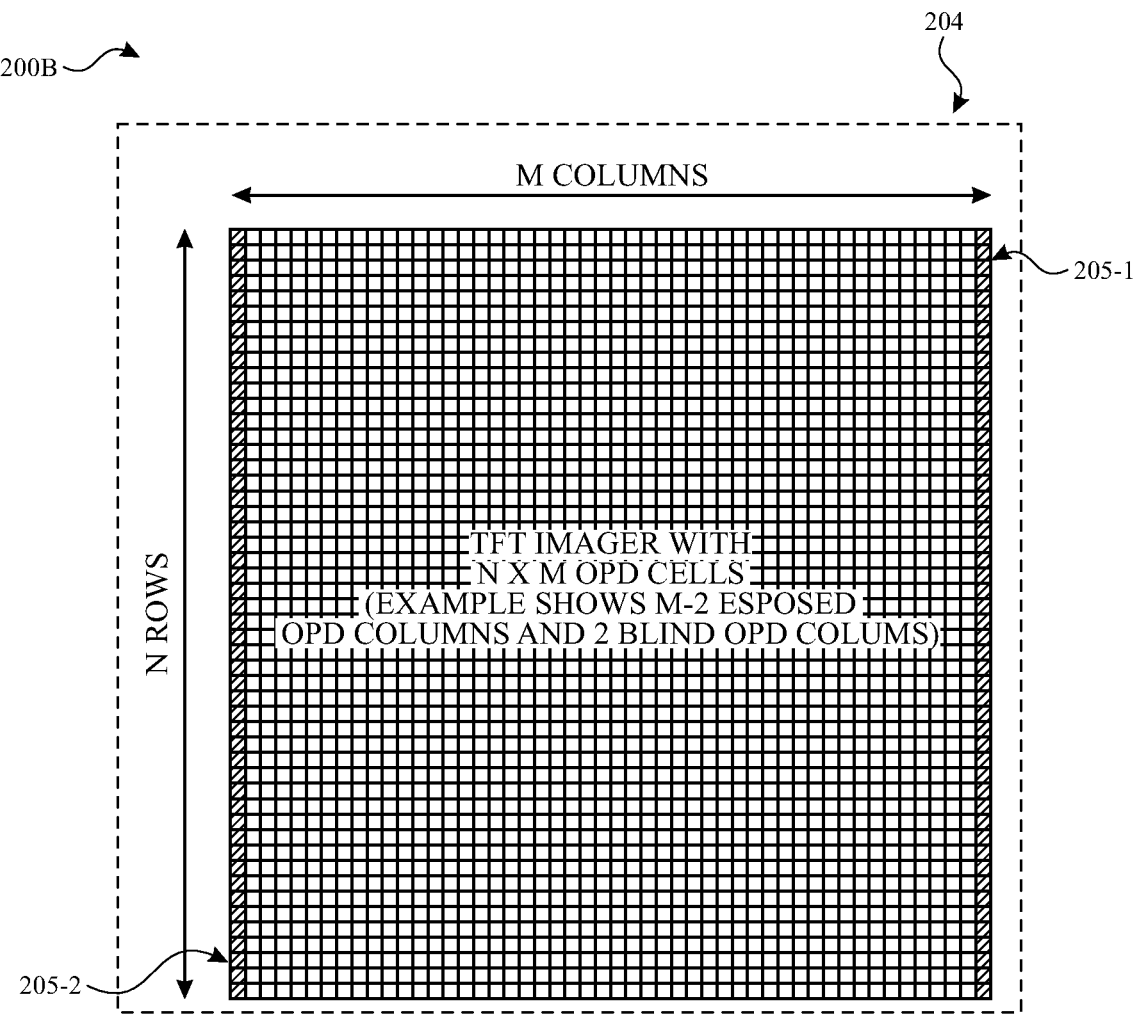
Figure 2B:
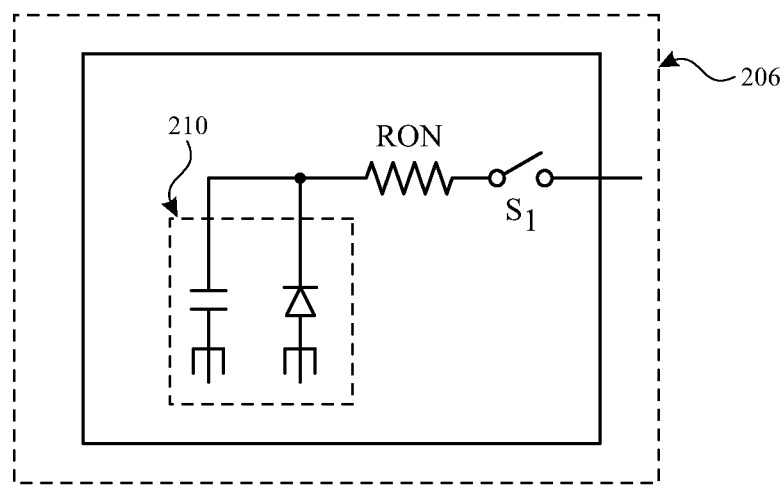
Figure 2C:
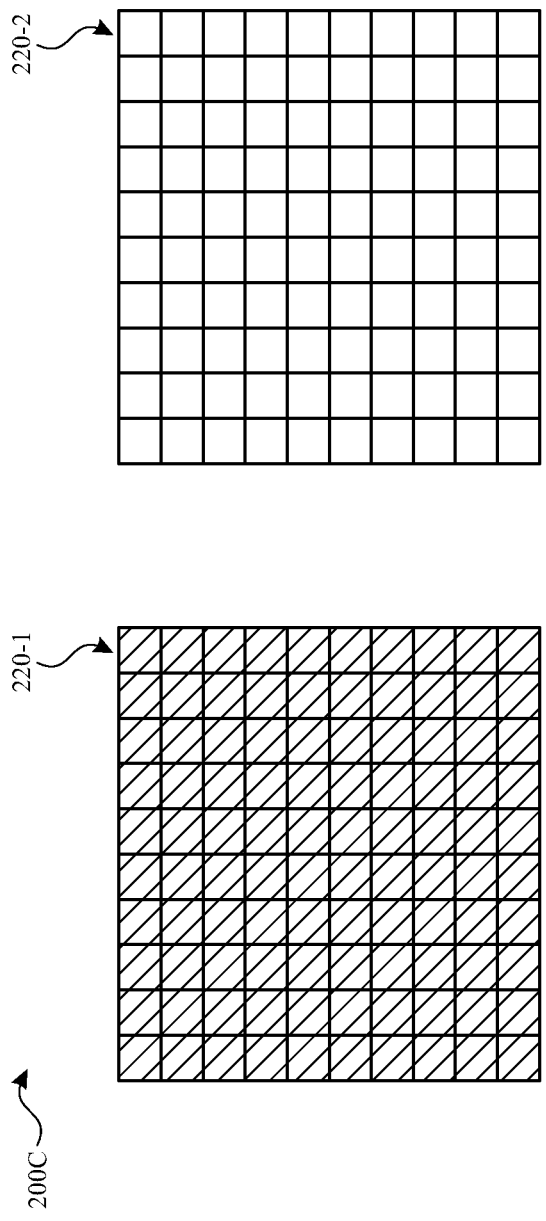

FIGS. 2A through 2C are diagrams illustrating example schemes 200A through 200C for temperature compensation in an optical-fingerprint detection system, in accordance with one or more aspects of the subject technology. In temperature compensation scheme 200A shown in FIG. 2A, two circuits 202-1 and 202-2 can be used to read a baseline charge and a baseline charge plus signal. Circuit 202-1 includes an OPD 210, a switch $S_1$ and a readout circuit 220. The OPD 210 is shown with an associated equivalent circuit similar to equivalent circuit 110 of FIG. 1A, except that the noise current source is not shown in FIG. 2A. In the Circuit 202-1, the switch $S_1$ is open, thus the readout circuit 220 is isolated from the OPD 210 and provides a first output (Reading 1) that includes only the baseline, which includes various noise components that are temperature dependent. Circuit 202-2 is similar to circuit 202-1, except that switch $S_1$ is closed and enables the readout circuit 220 to read the signal charge of the OPD 210 and provide a second output (Reading 2) that includes both baseline and signal reading. Therefore, a temperature compensated signal reading (Signal reading) can be obtained by subtracting the first output from the second output.

$$\text{Signal reading} = \text{Reading 2} - \text{Reading 1} \quad (1)$$

The temperature compensation scheme 200A can be applied to reading of pixels of each row of a TFT imager and is referred to as a row-based temperature compensation scheme and can be performed using a double sampling approach.

Temperature compensation scheme 200B shown in FIG. 2B is a blind sensor (e.g., OPD) scheme and can be described using a TFT-imager 204 that includes M columns and N rows of OPD pixels. One or more columns (e.g., two columns, such as 205-1 and 205-2) of TFT-imager 204 can be blind columns allocated for temperature compensation. Blind columns 205-1 and 205-2 can be any column of multiple (e.g., M) columns of TFT-imager 204, and their pixels are similar to the pixels of other columns of TFT-imager 204, except that they are shielded from illumination. In order to obtain a temperature compensation reading (Signal reading) the following is performed. First, a row-based correlated double sampling (CDS) is performed for all pixels of TFT-imager 204 including blind columns 205-1 and 205-2 to obtain corresponding readings from the exposed pixels (Reading 2) and pixels of blind columns 205-1 and 205-2 (Reading 1). Second, the temperature compensated reading (Signal reading) is obtained by subtracting Reading 1 from Reading 2, using the expression (1) above. Circuit 206 of FIG. 2B shows an OPD 210 along with a switch $S_1$ (also referred to as OPD switch). An on-resistance of the switch $S_1$ is shown as the resistor RON. Circuit 206 is provided here to illustrate that each pixel of TFT-imager 204 can be read out by closing OPD switch $S_1$.

While the example illustrated in FIG. 2B is of an OPD-based TFT-imager 204, it will be understood that other photodetectors can additionally or alternatively be used. Other examples of photodetectors include a PIN diode-based photodetector. A PIN diode is a diode with a wide, undoped intrinsic semiconductor region between a p-type semiconductor and an n-type semiconductor region. Accordingly, the photodetector can include a PIN diode-based photodetector in place of or in addition to the TFT-imager 204. It will be further understood that yet other photodetectors can additionally or alternatively be used.

Temperature compensation scheme 200C shown in FIG. 2C is a frame-based CDS concept that is described using two successive frames 220-1 (e.g., frame N) and 220-2 (e.g., frame N+1) of a TFT imager. The frame-based CDS concept can be performed by acquiring a first frame (frame N) reading without illumination to obtain a first reading (Reading 1), then acquiring a second frame (frame N+1) reading with illumination to obtain a second reading (Reading 2) and subtracting Reading 1 from Reading 2 to obtain the Signal reading. Reading 1 is associated with no illumination and thus includes only noise that is temperature-dependent. Subtracting Reading 1 from Reading 2 removes temperature-dependence from the Signal reading. A similar procedure can be followed to perform row-based CDS in a given frame. For row-based CDS, the first reading (Reading 1) is acquired with OPD switch (e.g., $S_1$ of FIG. 2B) open, and the second reading (Reading 2) is acquired with OPD switch closed.

In one or more implementations, other temperature compensation schemes may be conceived as a combination of the schemes 200A, 200B and 200C. These can be achieved, for example, by separately performing the schemes 200A, 200B and 200C and combining the results as desired.

Figure 3:
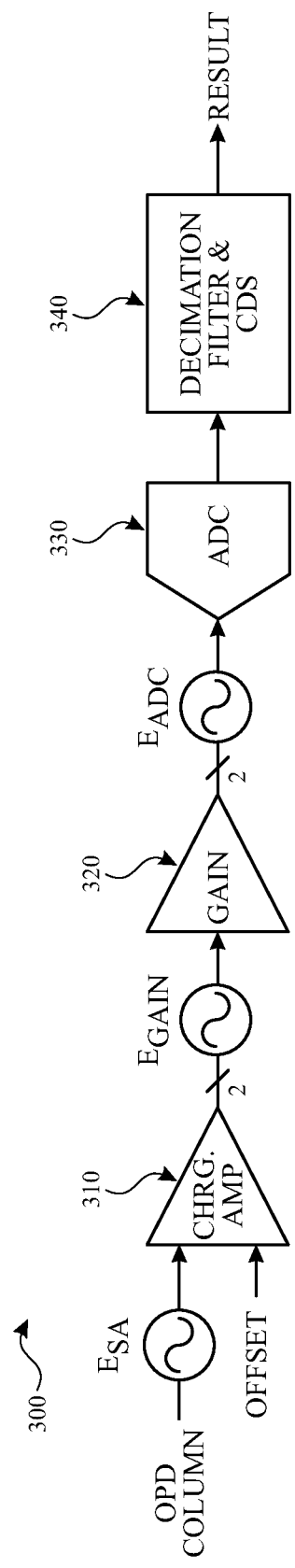
FIG. 3 is a schematic diagram illustrating an example low-noise analog front-end (AFE) circuit for an optical-fingerprint detection system, in accordance with one or more aspects of the subject technology.

FIG. 3 is a schematic diagram illustrating an example low-noise AFE circuit 300 for an optical-fingerprint detection system, in accordance with one or more aspects of the subject technology. The low-noise AFE circuit 300 includes a charge amplifier 310, a gain stage 320, an ADC 330 and a decimation filter and CDS circuit 340. Voltage signal sources $E_{SA}$, $E_{Gain}$ and $E_{ADC}$ are equivalent noise sources associated with the charge amplifier 310, gain stage 320 and ADC 330, respectively. Charge amplifier 310 can be a differential charge sensitive amplifier that receives an input charge signal from a pixel (e.g., OPD) of a TFT imager, removes a programmable offset, amplifies the offset-compensated charge signal and produces a voltage signal proportional to the offset-compensated charge signal. In some implementations, a single AFE circuit 300 can be used for a TFT-imager column. By removing the offset, the gain stage 320 can be added to provide a further gain (e.g., ×8) and is introduced by the subject technology to reduce the overall input referred ADC noise of the AFE circuit 300, as discussed herein. In some implementations, the gain stage 320 is configured to reduce the total sensor-referred noise of the ADC 330 by a gain of the gain stage 320. The ADC 330 converts the analog signal generated by the gain stage 320 to a digital signal that can be processed by the decimation filter and a CDS circuit 340.

In one or more implementations, the ADC 330 can be sigma-delta ADC. The decimation filter is, for example, a third order cascaded integrator-comb (CIC) decimation filter that can be an optimized class of a finite impulse response (FIR) filter combined with an interpolator decimator. The functionality of the gain stage 320 is to reduce the sensor-referred noise of the ADC 330 by the gain of the gain stage 320, as outlined above. For example, if an ADC (e.g., 330) is used that has a sensor-referred input noise of 860 electrons, by adding a gain stage (e.g., 320) with gain of 14V/V, the sensor input-referred noise can be reduced from about 860 electrons to about 860/14~61 electrons. It is understood that the offset compensated signal is small enough not to cause saturation of the gain stage 320.

Figure 4:
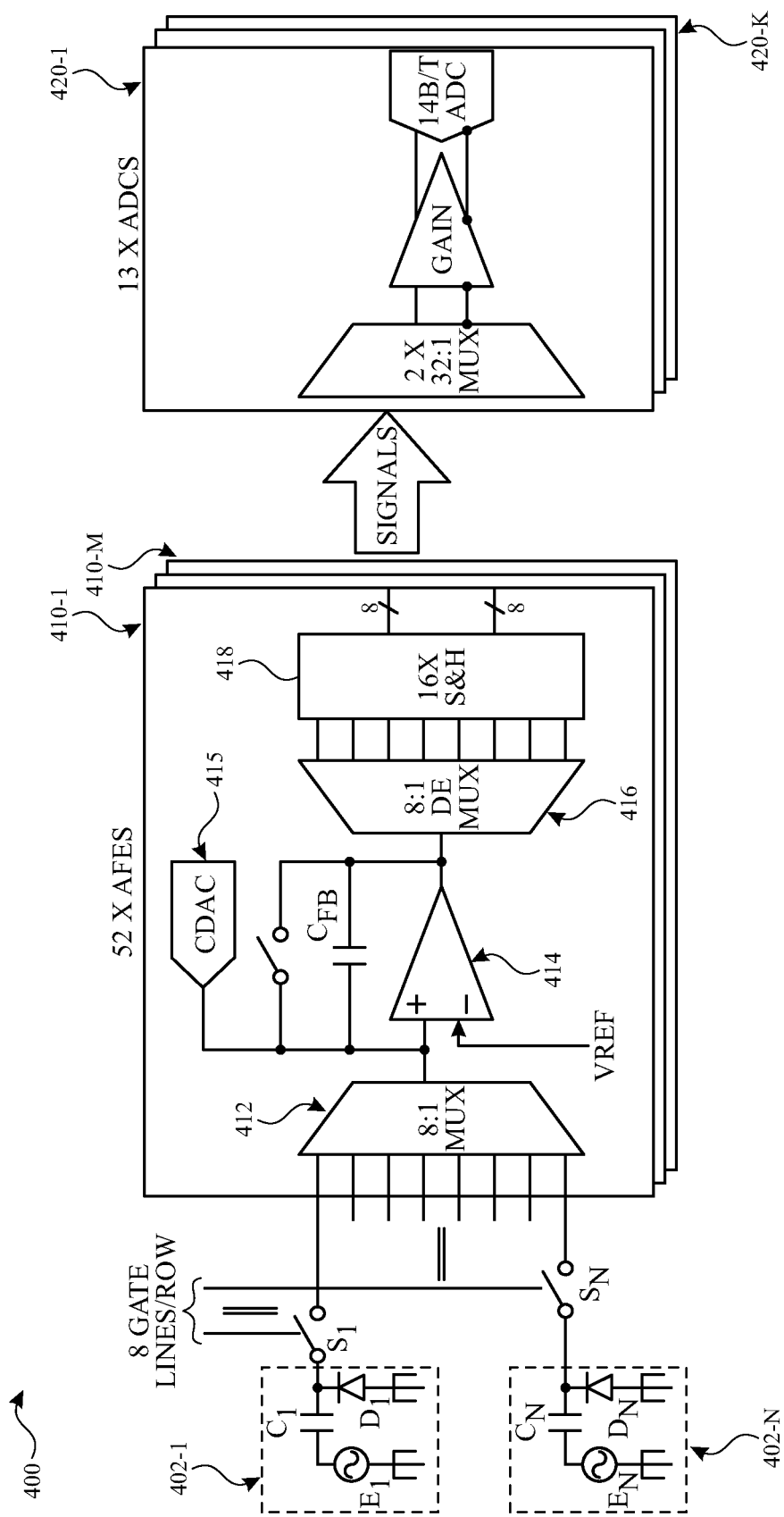
FIG. 4 is a schematic diagram illustrating an example multiplexed readout circuit for an optical-fingerprint detection system, in accordance with one or more aspects of the subject technology.

FIG. 4 is a schematic diagram illustrating an example multiplexed readout circuit 400 for an optical-fingerprint detection system, in accordance with one or more aspects of the subject technology. The multiplexed readout circuit 400 includes N (e.g., 8, 16 or more) OPDs 402 (e.g., 402-1 through 402-N), N OPD switches $S_1$ through $S_N$, a number of (e.g., M such as 52) AFE circuits 410 (e.g., 410-1 through 410-M) and K ADC circuits 420 (e.g., 420-1 through 420-K). Each OPD 402 is represented by a noise source E (e.g., $E_1$ through $E_N$), a diode Di (e.g., Di through DN) and a capacitance $C_1$ (e.g., $C_1$ through $C_N$), as described above. Each OPD 402 is coupled via an OPD switch $S_1$ (e.g., $S_1$ through $S_N$) to a column line of a TFT imager. Each AFE circuit 410 includes multiplexer (MUX) 412, a charge digital-to-analog converter (CDAC) 415, a charge amplifier 414, a demultiplexer (DEMUX) 416 and a sample-and-hold (S&H) circuit 418.

MUX 412 (e.g., an N-to-1 MUX) is a feature of the subject technology that allows using a single amplifier (e.g., 414), instead of N charge amplifiers, for N (e.g., 8, 16 or more) OPDs. The DEMUX is known as a 1-to-N DEMUX and the S&H circuit 418 is a known circuit that provides N (e.g., 8) differential output signals that are the output signals of the AFE 410. The output signals of the AFE 410 are fed into K (e.g., 13) known ADC circuits 420. The use of MUX 412 allows reading multiple (e.g., N, such as 8, 16 or more) columns using a single charge amplifier, rather than N charge amplifiers that can significantly reduce chip area and cost of the readout circuit.

Figure 5:
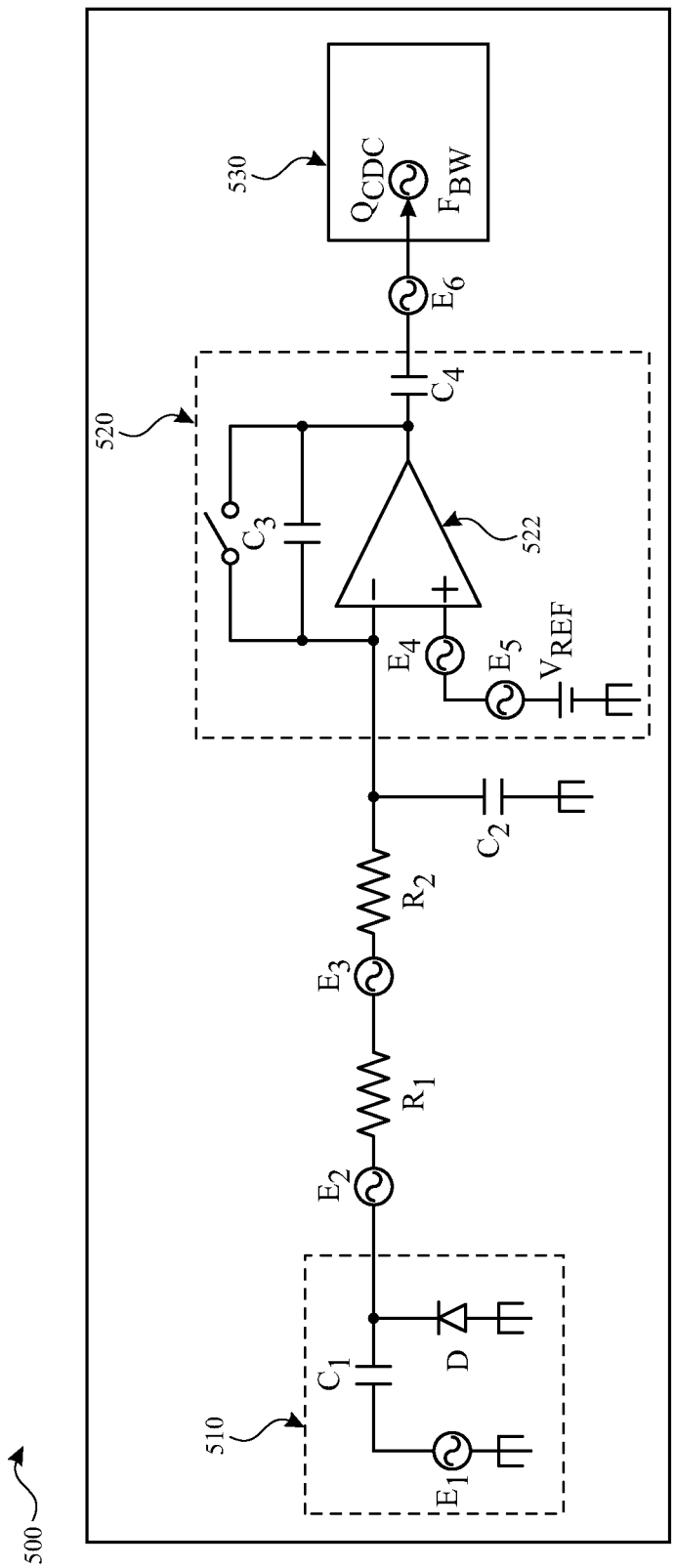
FIG. 5 is a schematic diagram illustrating an example readout circuit for an optical-fingerprint detection system, in accordance with one or more aspects of the subject technology.

FIG. 5 is a schematic diagram illustrating an example readout circuit 500 for an optical-fingerprint detection system, in accordance with one or more aspects of the subject technology. Readout circuit 500 includes an OPD 510, a charge magnifier 520 and an off-the-shelf readout circuit 530. OPD 510 is similar to the OPD 420 of FIG. 4. $R_1$ is an on-resistance of an OPD switch (not shown) and $R_2$ is the resistance associated with column capacitor $C_2$. $E_2$ and $E_3$ represent voltage noise sources associated with the OPD switch and column capacitance $C_2$, respectively. Charge magnifier 520 includes a preamplifier 522 and a switched feedback capacitor $C_3$. Charge magnifier 520 receives an input voltage from column capacitance $C_2$ at its inverting input and a reference voltage $V_{REF}$ at its non-inverting input. $E_4$ and $E_5$ represent voltage noise sources associated with the non-inverting input of preamplifier 522 and reference voltage $V_{REF}$, respectively. Capacitor $C_4$ is an output capacitance of preamplifier 522, and $E_6$ is a voltage noise source representing a total output-referred noise.

Charge magnifier 520 is a low-noise charge magnifier introduced by the subject technology to reduce the input-referred noise of the readout circuit 500. A charge gain (GC) of charge magnifier 520 is defined by feedback capacitance ($C_3$) and output capacitance ($C_4$) and is given by: $GC=C_4/C_3$. The input-referred noise (QE_IN) of the readout circuit 500 can be reduced by a charge magnifier gain as shown by the following expression:

$$QE\_IN=E\_CM*SQRT(FBW)*(1+CCOL/CFB)*CFB/QE \qquad (2)$$

Where, E_CM is the total input referred voltage noise density (Nv/rtHz) of charge magnifier 520 and can be expressed as:

$$E\_CM=SQRT((E\_SA)^2+(E\_REF)^2) \qquad (3)$$

FBW is the bandwidth (e.g., 40 KHz) of readout circuit 500, CCOL (in F) is column capacitance ($C_2$, e.g., 10 pF), CFB represents feedback capacitance of preamplifier 522 ($C_3$, e.g., 25 pF) and QE is the electron charge. For the example values of the parameters as shown in parentheses above, the total input referred noise charge of the readout circuit 500 will be about 136 electrons.

Figure 6:
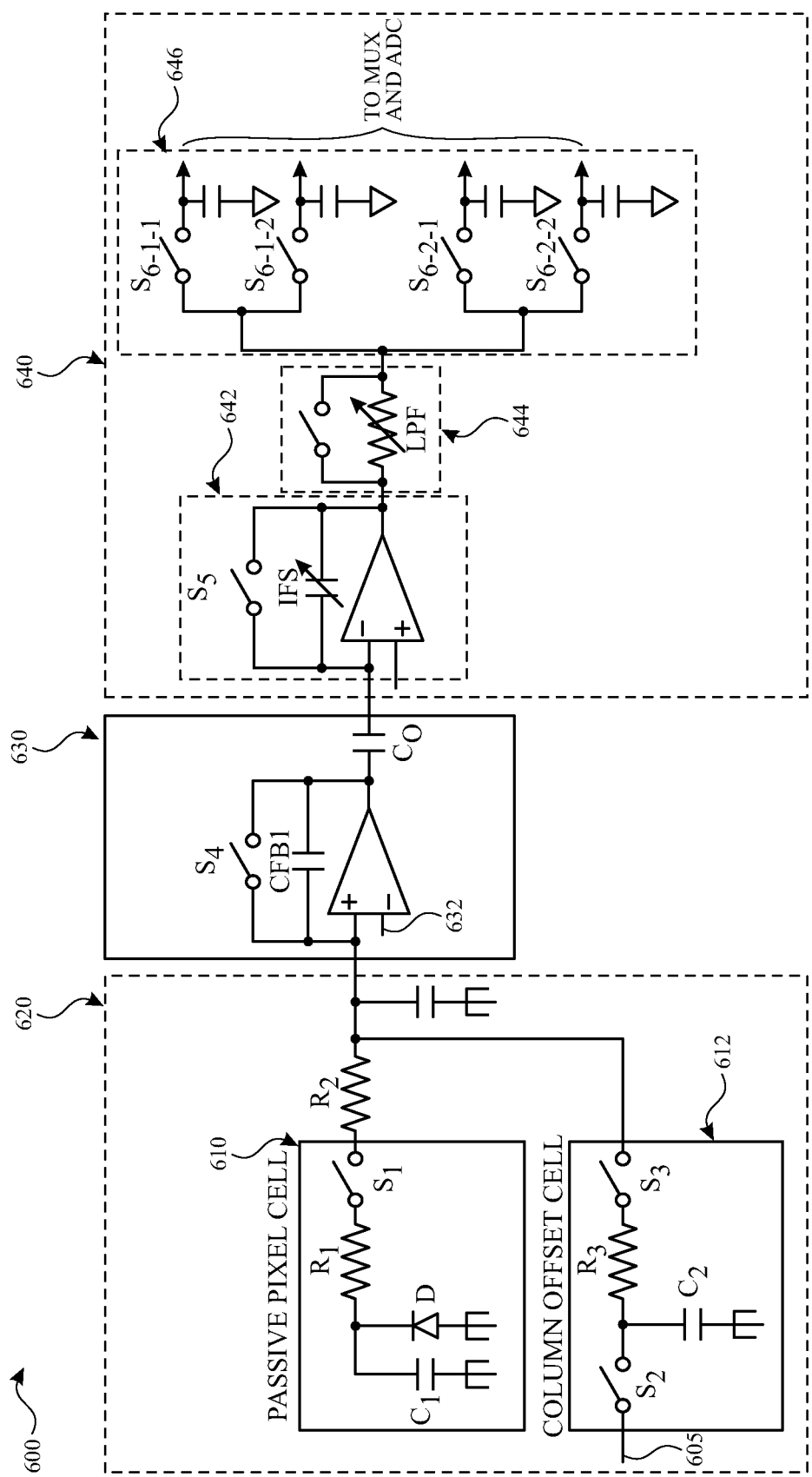
FIG. 6 is a schematic diagram illustrating an example readout circuit using a pixel-based mitigating technique for offset charge injection into a charge magnifier circuit for an optical-fingerprint detection system, in accordance with one or more aspects of the subject technology.

FIG. 6 is a schematic diagram illustrating an example readout circuit 600 using a pixel-based mitigating technique for an offset charge injection into a charge magnifier circuit for an optical-fingerprint detection system, in accordance with one or more aspects of the subject technology. Example readout circuit 600 includes a passive pixel and offset cell 620, a charge magnifier 630 and readout circuit 640. Passive pixel and offset cell 620 includes an OPD 610 and column offset cell 612. OPD cell 610 is modeled by the capacitor $C_1$ and diode D and includes an OPD switch $S_1$ and a corresponding on-resistance $R_1$. Column offset cell 612 includes offset capacitor $C_2$, offset switches $S_2$ and $S_3$ and on-resistance $R_3$ of switch $S_3$. Charge magnifier 630 is similar to charge magnifier 520 of FIG. 5, except that non-inverting input 632 can be optionally connected to an offset voltage, as discussed herein. Readout circuit 640 includes an integrator 642 including a reset switch $S_5$, a LPF 644 and a switch-capacitor block 646 including switches $S_{6-1-1}$, $S_{6-1-2}$, $S_{6-2-1}$ and $S_{6-2-2}$.

Column offset cell 612 is to provide an offset charge to be subtracted from the OPD charge (signal) provided by OPD 610. The subtraction of the offset charge from the OPD charge can remove a typically large offset charge included in the OPD charge from the OPD signal. In one or more implementations, the offset charge provided by column offset cell 612 can, instead, be applied to non-inverting input 632 of preamplifier 630. The charging of offset capacitor $C_2$ can be performed by, for example, an external digital-toanalog converter (DAC) connected to node 605 of column offset cell 612. For proper operation of the readout circuit 600, switch $S_2$ and reset switch $S_4$ are closed at an initial time $t_0$, next, reset switch $S_5$ and switch $S_{6-1-1}$ are respectively closed at times $t_1$ and $t_2$. Switches $S_1$ and $S_3$ are closed at time $t_3$ and finally switch $S_{6-1-2}$ is closed at time $t_4$. The offset charge produced by column offset cell 612 is dumped into the column at time $t_3$ when OPD switches $S_1$ and $S_3$ are closed. The delayed reset of integrator 642 by closing reset switch $S_5$ at a delayed time $t_1$ (with respect to resetting charge magnifier 630 at time $t_0$) can mitigate charge injection to charge magnifier 630, due to the release of switch $S_4$.

Figure 7:
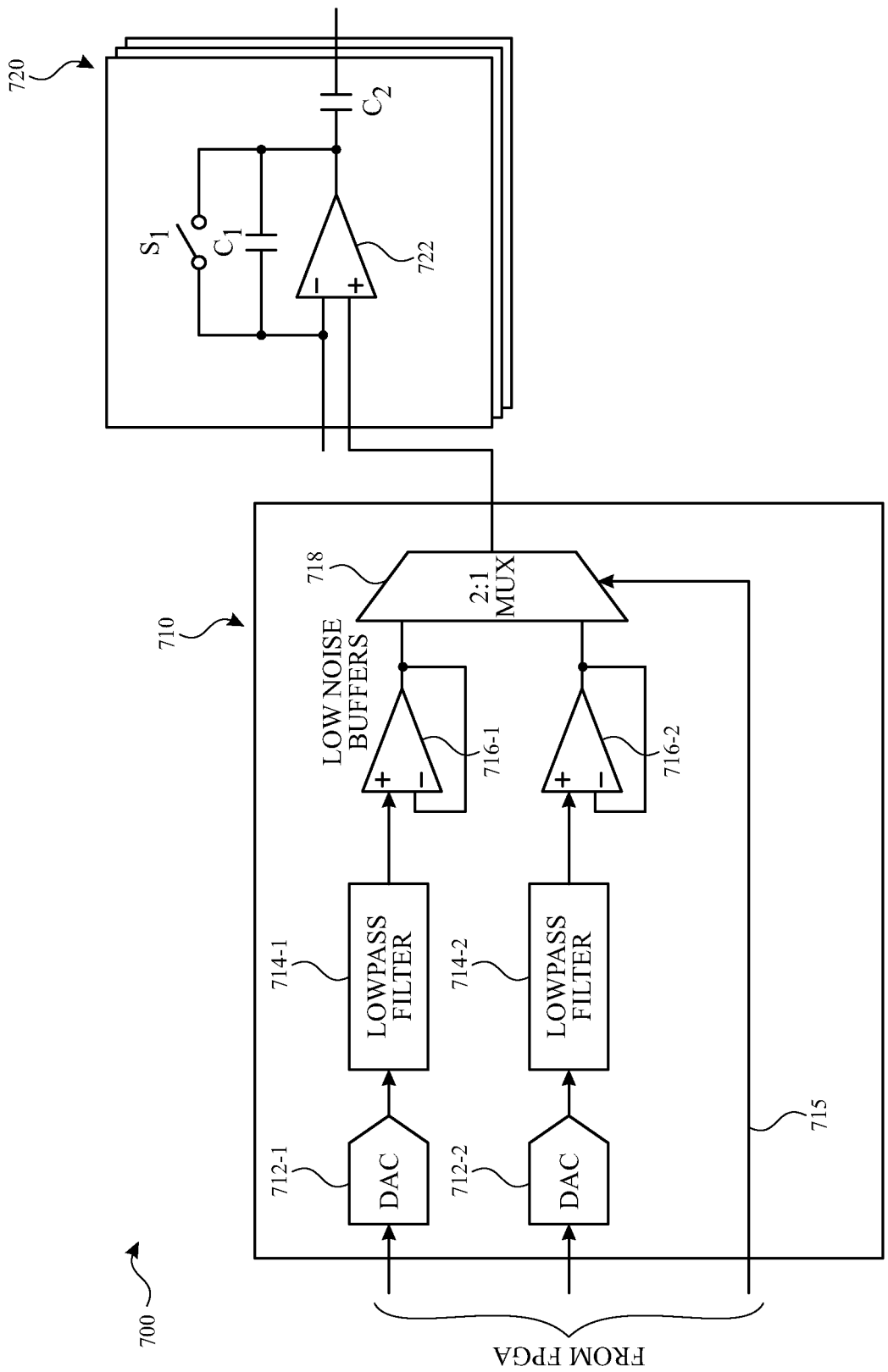
FIG. 7 is a schematic diagram illustrating an example circuit for implementing a frame-based mitigation technique to offset charge injection into a charge magnifier circuit, in accordance with one or more aspects of the subject technology.

FIG. 7 is a schematic diagram illustrating an example circuit 700 for implementing a frame-based mitigation technique to offset charge injection into a charge magnifier circuit, in accordance with one or more aspects of the subject technology. Example circuit 700 includes a bias control circuit 710 that is shared by an array of charge magnifiers 720. The bias control circuit 710 can generate a bias voltage at a non-inverting input of each of the charge magnifiers of array of charge magnifiers 720. The generated bias voltage can remove an offset component included in the sensor (e.g., OPD) signal prior to amplification of the sensor signal.

Bias control circuit 710 provides two programmable bias voltages $V_{BIAS1}$ and $V_{BIAS2}$ for array of charge magnifiers 720. Bias control circuit 710 includes DACs 712 (e.g., 712-1 and 712-2), LPFs 714 (e.g., 714-1 and 714-2) to reduce DAC noise, low-noise buffers 716 (e.g., 716-1 and 716-2) and a MUX 718 (e.g., a 2-to-1 MUX). A select signal 715 and input signals to the DACs 712 can be provided by an external circuit (e.g., a field-programmable gate array (FPGA)) and can be programmable. Select signal 715 can select a first bias voltage ($V_{BIAS1}$) from low-noise buffer 716-1 during even frame numbers and can select a second bias voltage ($V_{BIAS2}$) from low-noise buffer 716-2 during odd frame numbers. The sensor (e.g., OPD) is reset by the first bias voltage ($V_{BIAS1}$) during even frames and is read out with the second bias voltage ($V_{BIAS2}$) during odd frame numbers. This technique reduces the effective frame rate by 2×, but significantly reduces the offset charge (or voltage) of the sensor. In order to maintain the frame rate of the sensor, reading with the second bias voltage can be immediately followed by resetting the sensor with the first bias voltage (e.g. at the end of the row time) without waiting for an entire frame.

Figure 8:
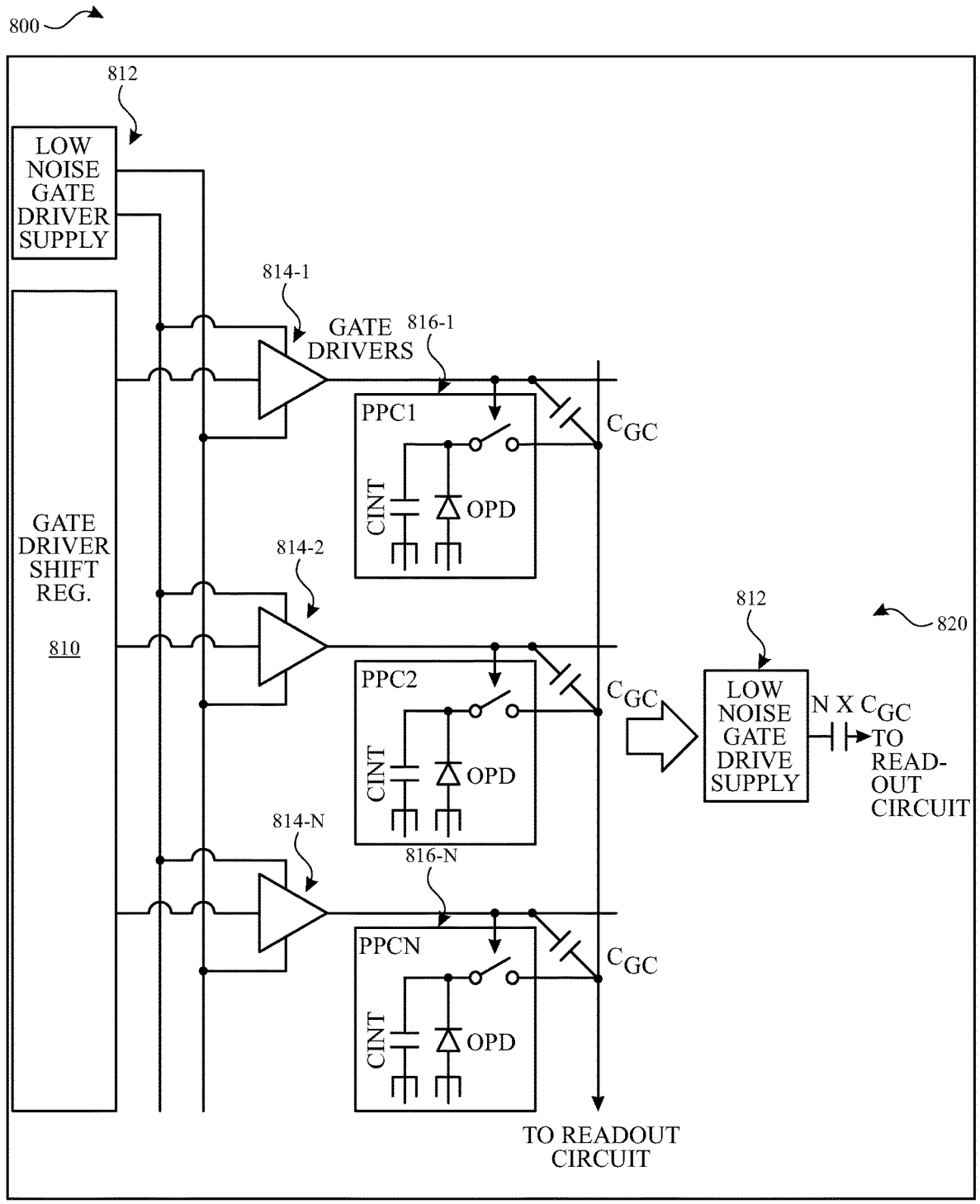
FIG. 8 is a schematic diagram illustrating an example circuit depicting a low-noise gate-driver supply coupling in an optical-fingerprint detection system, in accordance with one or more aspects of the subject technology.

FIG. 8 is a schematic diagram illustrating an example circuit 800 depicting a low-noise gate-driver supply coupling in an optical-fingerprint detection system, in accordance with one or more aspects of the subject technology. Example circuit 800 includes a gate-driver shift register 810, a gate-driver supply 812, gate drivers 814 (e.g., 814-1 through 814-N) and passive pixel cells (PPCs) 816 (e.g., 816-1 through 816-N). Gate-driver supply 812 provides supply voltage for gate drivers 814 and needs to be a low-noise gate-diver supply, described herein with respect to FIG. 9. Coupling capacitors $C_{GC}$ represent gate-to-column capacitances and each of them includes a gate line-to-column coupling capacitance and a PPC switch gate-to-column capacitance. The total coupling capacitance from gate-driver supply 812 to a readout circuit is a function of the number (N) of PPCs on each column, and as shown by the equivalent circuit 820 is equal to N×$C_{GC}$. The gate-driver supply noise (in electrons) has to be limited based on a readout input-referred noise requirement (QNZ_GD):

$$QNZ\_GD=VNZ\_G*N*C_{GC}/Q\_E \qquad (4)$$

Where, VNZ_G is an output referred integrated noise of the gate-driver supply 812, N is the number of PPCs per column, and Q_E is the electron charge. It is understood that QNZ_GD should be a small portion of the overall input-referred charge noise budget.

Figure 9:
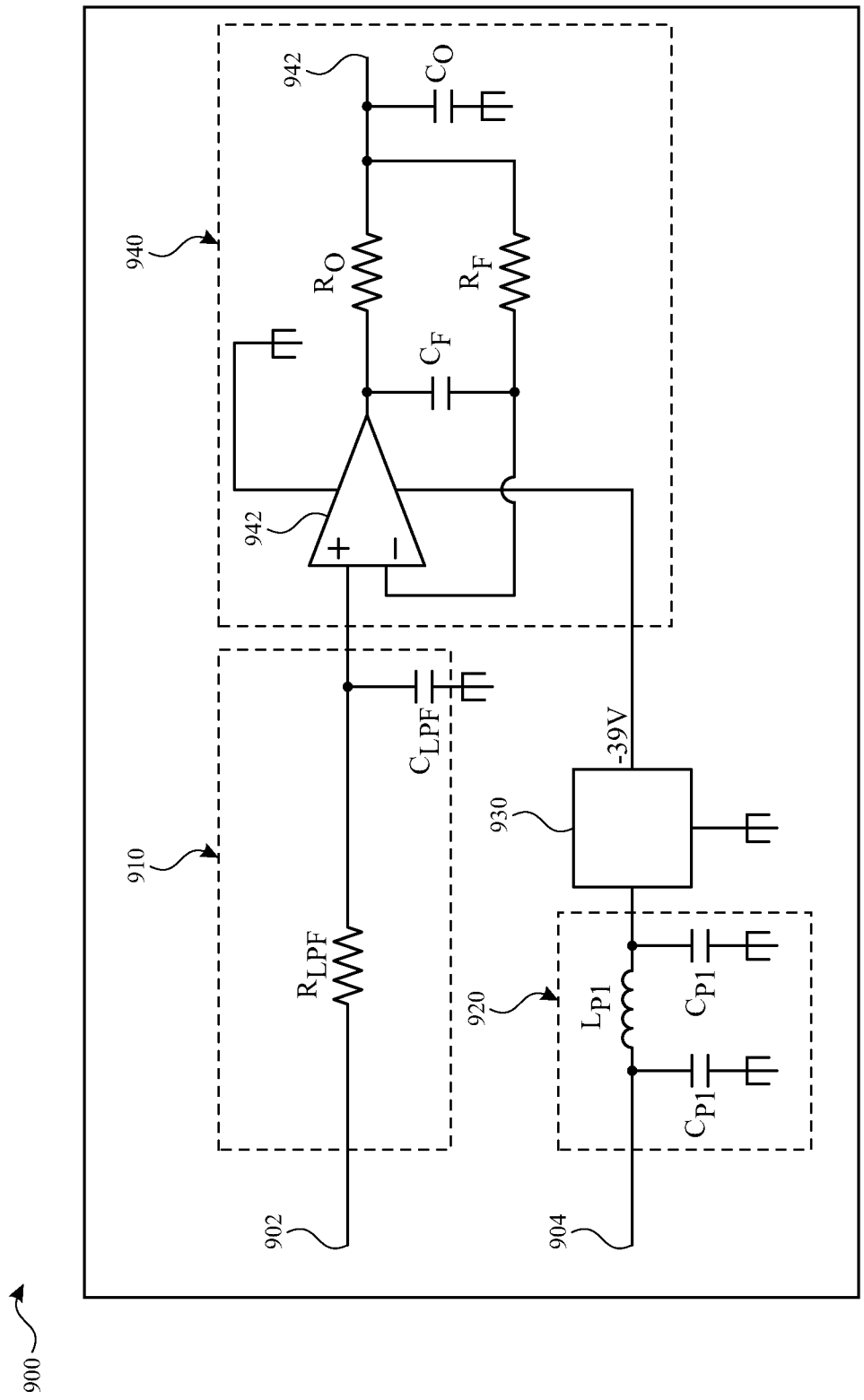
FIG. 9 is a schematic diagram illustrating an example circuit for negative low-noise gate-driver supply in an optical-fingerprint detection system, in accordance with one or more aspects of the subject technology.

FIG. 9 is a schematic diagram illustrating an example circuit 900 for negative low-noise gate-driver supply in an optical-fingerprint detection system, in accordance with one or more aspects of the subject technology. In one or more implementations, gate-driver supply 812 of FIG. 8 can be implemented by circuit 900 that includes an LPF 910, a pi-network 920, a pre-regulator 930 and a low-noise buffer 940. Low-noise buffer 940 can include a low-noise OPAMP, an output bypass network including resistance $R_O$ and capacitance $C_O$ and a feedback network including a feedback resistor $R_F$ and a feedback capacitor $C_F$. $R_O$ may be used for maintaining stability. In order to maintain output voltage due to transient currents through $R_O$ and for stability, a secondary feedback network comprised of $R_F$ and $C_F$ can be provided whose time constant is matched to $R_O$ and $C_O$. LPF 910 includes $R_{LPF}$ and $C_{LPF}$ and cuts off input noise from a DAC-generated voltage input 902. Pi-network 920 can provide additional attenuation of AC noise from supply and can be optimized to provide maximum attenuation of supply AC noise dependent on the spectral properties (e.g. frequency) of the AC noise. Pre-regulator 930 provides additional power supply rejection and can limit low-noise buffer supply to a suitable value (e.g., less 36 V). Pre-regulators and/or filters may be optional if preceding supplies are sufficiently low noise. Low-noise buffer and filters may be replaced with a suitable low-noise LDO with sufficiently high PSRR to meet output noise requirements set forth above are met. The low-noise buffer's positive supply can be referenced to another positive supply above ground, which may have additional filtering similar to 920 and 930.

Figure 10:
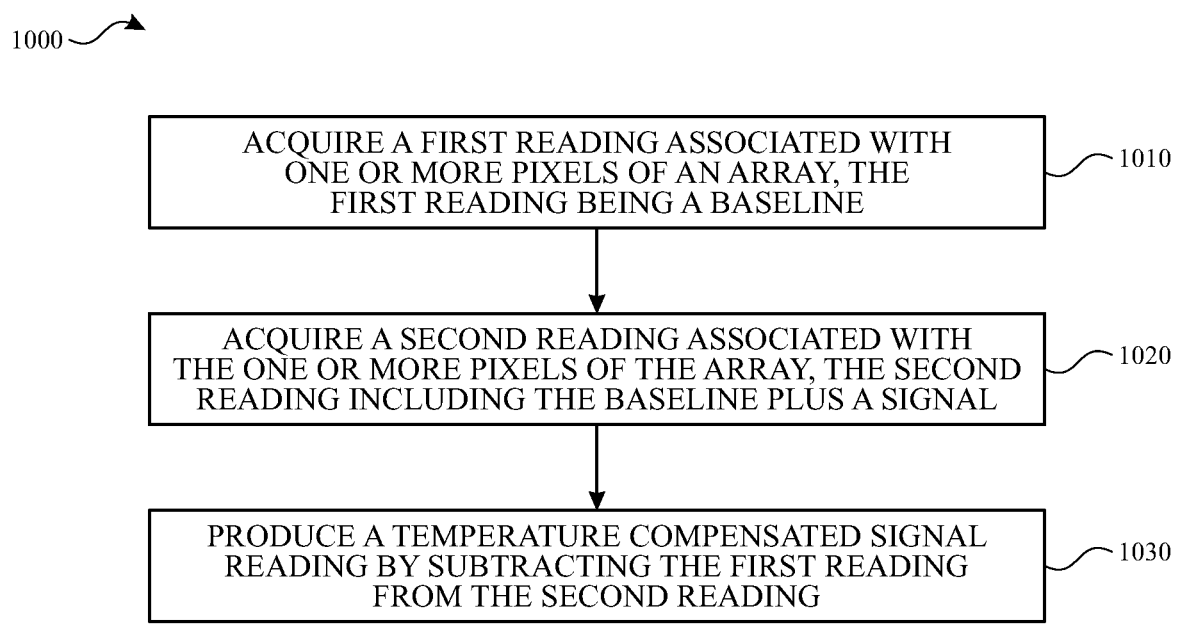
FIG. 10 is a flow diagram illustrating an example method of temperature compensation in an optical-fingerprint detection system, in accordance with one or more aspects of the subject technology.

FIG. 10 is a flow diagram illustrating an example method 1000 of temperature compensation in an optical-fingerprint detection system, in accordance with one or more aspects of the subject technology. The example method 1000 includes acquiring a first reading (e.g., Reading 1, FIG. 2A) associated with one or more pixels (e.g., 210 of FIG. 2A) of an array (e.g., 204 of FIG. 2B), the first reading being a baseline (1010). The method further includes acquiring a second reading (e.g., Reading 2, FIG. 2A) associated with the one or more pixels of the array, the second reading including the baseline plus a signal (1020). A temperature compensated signal reading is produced by subtracting the first reading from the second reading (1030).

Figure 11:
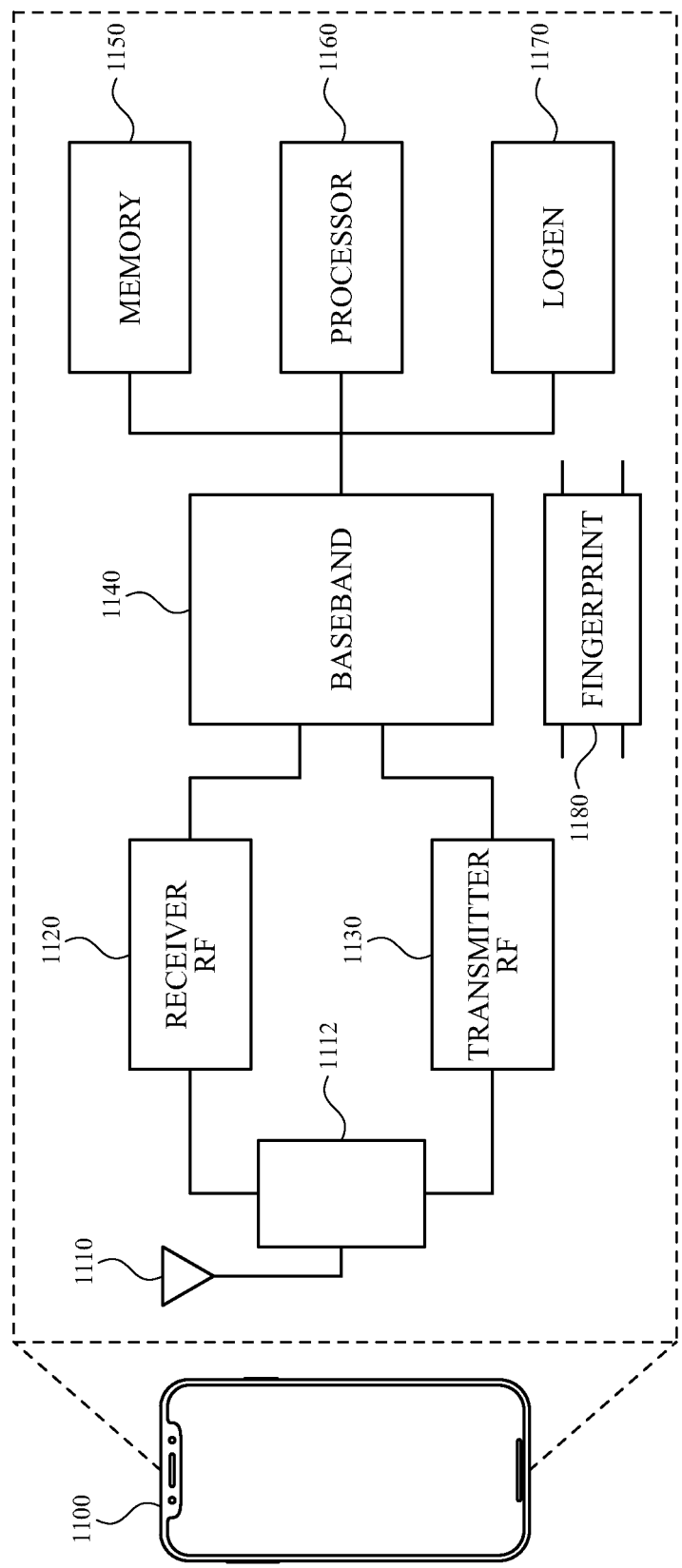
FIG. 11 is a block diagram illustrating a wireless communication device, within which one or more aspects of the subject technology can be implemented.

FIG. 11 is a block diagram illustrating a wireless communication device 1100, within which one or more aspects of the subject technology can be implemented. In one or more implementations, the wireless communication device 1100 can be a smart phone or a smart watch that hosts an apparatus of the subject technology including an optical-fingerprint detection system. The wireless communication device 1100 may comprise a radio-frequency (RF) antenna 1110, duplexer 1112, a receiver 1120, a transmitter 1130, a baseband processing module 1140, a memory 1150, a processor 1160, a local oscillator generator (LOGEN) 1170, and one or more fingerprint detection modules 1180. In various embodiments of the subject technology, one or more of the blocks represented in FIG. 11 may be integrated on one or more semiconductor substrates. For example, the blocks 1120-1170 may be realized in a single chip or a single system on a chip, or may be realized in a multichip chipset.

The receiver 1120 may comprise suitable logic circuitry and/or code that may be operable to receive and process signals from the RF antenna 1110. The receiver 1120 may, for example, be operable to amplify and/or down-convert received wireless signals. In various embodiments of the subject technology, the receiver 1120 may be operable to cancel noise in received signals and may be linear over a wide range of frequencies. In this manner, the receiver 1120 may be suitable for receiving signals in accordance with a variety of wireless standards, Wi-Fi, WiMAX, Bluetooth, and various cellular standards. In various embodiments of the subject technology, the receiver 1120 may not use any saw-tooth acoustic wave (SAW) filters and few or no off-chip discrete components such as large capacitors and inductors.

The transmitter 1130 may comprise suitable logic circuitry and/or code that may be operable to process and transmit signals from the RF antenna 1110. The transmitter 1130 may, for example, be operable to up-convert baseband signals to RF signals and amplify RF signals. In various embodiments of the subject technology, the transmitter 1130 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 1130 may be operable to provide signals for further amplification by one or more power amplifiers.

The duplexer 1112 may provide isolation in the transmit band to avoid saturation of the receiver 1120 or damaging parts of the receiver 1120, and to relax one or more design requirements of the receiver 1120. Furthermore, the duplexer 1112 may attenuate the noise in the receive band. The duplexer may be operable in multiple frequency bands of various wireless standards.

The baseband processing module 1140 may comprise suitable logic, circuitry, interfaces, and/or code that may be operable to perform processing of baseband signals. The baseband processing module 1140 may, for example, analyze received signals and generate control and/or feedback signals for configuring various components of the wireless communication device 1100, such as the receiver 1120. The baseband processing module 1140 may be operable to encode, decode, transcode, modulate, demodulate, encrypt, decrypt, scramble, descramble, and/or otherwise process data in accordance with one or more wireless standards.

The processor 1160 may comprise suitable logic, circuitry, and/or code that may enable processing data and/or controlling operations of the wireless communication device 1100. In this regard, the processor 1160 may be enabled to provide control signals to various other portions of the wireless communication device 1100. The processor 1160 may also control transfer of data between various portions of the wireless communication device 1100. Additionally, the processor 1160 may enable implementation of an operating system or otherwise execute code to manage operations of the wireless communication device 1100. In one or more implementations, the processor 1160 can be used to process signals of the under-display fingerprint sensor of the subject technology (e.g., signals from the image sensor 150 of FIG. 1A) to generate a fingerprint image and compare the fingerprint image with a number of reference fingerprints stored in a database to identify and/or authenticate a person associated with the fingerprint.

The memory 1150 may comprise suitable logic, circuitry, and/or code that may enable storage of various types of information such as received data, generated data, code, and/or configuration information. The memory 1150 may comprise, for example, RAM, ROM, flash, and/or magnetic storage. In various embodiments of the subject technology, information stored in the memory 1150 may be utilized for configuring the receiver 1120 and/or the baseband processing module 1140. In some implementations, the memory 1150 may store image information from processed and/or unprocessed fingerprint images of the under-display fingerprint sensor of the subject technology. The memory 1150 may also include one or more databases of reference fingerprints that can be used to identify and/or authenticate a person associated with the fingerprint.

The LOGEN 1170 may comprise suitable logic, circuitry, interfaces, and/or code that may be operable to generate one or more oscillating signals of one or more frequencies. The LOGEN 1170 may be operable to generate digital and/or analog signals. In this manner, the LOGEN 1170 may be operable to generate one or more clock signals and/or sinusoidal signals. Characteristics of the oscillating signals such as the frequency and duty cycle may be determined based on one or more control signals from, for example, the processor 1160 and/or the baseband processing module 1140.

In operation, the processor 1160 may configure the various components of the wireless communication device 1100 based on a wireless standard according to which it is desired to receive signals. Wireless signals may be received via the RF antenna 1110, amplified, and down-converted by the receiver 1120. The baseband processing module 1140 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 1150, and/or information affecting and/or enabling operation of the wireless communication device 1100. The baseband processing module 1140 may modulate, encode, and perform other processing on audio, video, and/or control signals to be transmitted by the transmitter 1130 in accordance with various wireless standards.

In one or more implementations, the fingerprint detection modules 1180 may include a readout circuit that can use the temperature compensation methods discussed above (e.g., with respect to FIGS. 2A through 2C). The readout circuit may also use other aspects of the subject technology, for example, the multiplexed AFE, the charge magnifier, the column charge offset compensation and the low-noise gate driver of the subject technology to improve functionality of the fingerprint detection modules 1180.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter genders (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method of temperature compensation in an optical-fingerprint detection system, the method comprising:

acquiring, by using a readout circuit, a first reading associated with at least one pixel of an array, wherein the first reading includes temperature-dependent noise components;

acquiring, by using the readout circuit, a second reading associated with the at least one pixel of the array, wherein the second reading includes both the temperature-dependent noise components and a signal reading; and producing a temperature compensated signal reading corresponding to the signal reading by subtracting the first reading from the second reading, wherein the array comprises an optical-fingerprint array, the at least one pixel of the array is coupled to the readout circuit via at least one pixel switch, and the first reading is a baseline reading.

2. The method of claim 1, wherein a temperature compensation scheme comprises a row-based scheme, wherein the at least one pixel of the array comprises pixels of a row of the array, and wherein acquiring the first reading is performed while corresponding pixel switches are open.

3. The method of claim 2, wherein acquiring the second reading is performed while corresponding pixel switches are closed.

4. The method of claim 1, wherein a temperature compensation scheme comprises a blind pixel scheme, wherein the at least one pixel of the array comprises entire pixels of the array, wherein pixels of one or more columns of the array comprise blind pixels that are shielded from optical exposure.

5. The method of claim 4, wherein acquiring the first reading comprises performing a first row-based double sampling for blind pixels, and wherein acquiring the second reading comprises performing a second row-based double sampling for exposed pixels.

6. The method of claim 1, wherein a temperature compensation scheme comprises a frame-based scheme, wherein the at least one pixel of the array comprises entire pixels of the array, wherein acquiring the first reading comprises performing a first frame-based double sampling while the array is not illuminated, and wherein acquiring the second reading comprises performing a second frame-based double sampling while the array is illuminated.

7. The method of claim 1, wherein the temperature compensation method comprises a combination of at least two methods, wherein the at least two methods comprise a row-based method, a blind method and a frame-based method.

* * * * *